A circuit board includes multiple signal layers, in which

(12) United States Patent
Alexander et al.

(10) Patent No.: US 7,045,719 B1
(45) Date of Patent: May 16, 2006

(54) ENHANCING SIGNAL PATH CHARACTERISTICS IN A CIRCUIT BOARD

(75) Inventors: Arthur R. Alexander, Valley Center, CA (US); James L. Knighten, Poway, CA (US); Jun Fan, Escondido, CA (US)

(73) Assignee: NCR Corp., Dayton, OH (US)

( * ) Notice: Subject to any disclaimer, the term of this patent is extended or adjusted under 35 U.S.C. 154(b) by 111 days.

(21) Appl. No.: 10/274,573

(22) Filed: Oct. 21, 2002

Related U.S. Application Data

(63) Continuation-in-part of application No. 10/145,436, filed on May 14, 2002.

(51) Int. Cl.
*H01R 12/04* (2006.01)

(52) U.S. Cl. ............. 174/262; 361/761; 361/780; 361/794; 29/852

(58) Field of Classification Search ........ 174/262–266; 361/761–764, 780, 792–795; 28/852–853
See application file for complete search history.

(56) References Cited

U.S. PATENT DOCUMENTS 4,868,350 A * 9/1989 Hoffarth et al. ............ 174/266
6,229,095 B1 * 5/2001 Kobayashi .................. 174/255
6,353,999 B1 * 3/2002 Cheng ........................ 29/852

OTHER PUBLICATIONS

U.S. Appl. No. 10/641,476, filed Aug. 15, 2003, Alexander et al.
U.S. Appl. No. 10/145,436, filed May 14, 2002, Alexander et al.

* cited by examiner

*Primary Examiner*—Kamand Cuneo
*Assistant Examiner*—Jeremy Norris
(74) *Attorney, Agent, or Firm*—Trop, Pruner & Hu P.C.; John D. Cowart

(57) ABSTRACT

A circuit board includes multiple signal layers, in which signal lines are routed, and power reference plane layers, in which power reference planes (e.g., power supply voltage or ground) are provided. Vias are passed through at least one signal layer and at least one power reference plane layer, or alternatively, vias are passed through at least two power reference plane layers. In one arrangement, a first clearance is defined around the via at the signal layer and a second clearance is defined around the via at the power reference plane layer. The second clearance is larger in size than the first clearance to match or tailor the impedance of the via as closely as possible with the impedance of the signal line that the via is electrically connected to. In another arrangement, clearances around vias at different power reference plane layers are selected to have different sizes to enhance the ability of one of the power reference plane layers (the one with a smaller clearance size) to carry a higher current level.

11 Claims, 9 Drawing Sheets

ENHANCING SIGNAL PATH CHARACTERISTICS IN A CIRCUIT BOARD

CROSS REFERENCE TO RELATED APPLICATIONS

This is a continuation-in-part of U.S. Ser. No. 10/145,436, filed May 14, 2002.

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, by use of connectors or by directly mounting the devices onto a surface of the circuit board. A circuit board includes the wiring required to interconnect the devices electrically and also provides the primary support for the devices.

A circuit board typically includes multiple layers, which can range from two layers to fifty or more layers, as examples. Some layers are used for signal transmission, while other layers are used for power reference planes. A power reference plane is a plane that is connected to a reference voltage, such as ground, a three-volt voltage, a five-volt voltage, or some other power supply voltage. Some reference planes may even be coupled to more than one voltage.

As IC technology has steadily improved, the number of transistors that can be placed into each IC device has dramatically increased. This has led to a corresponding increase in the number of input/output (I/O) pins on such IC devices. The increase in I/O pins on IC devices means that more signals are routed on a circuit board, which in turn means a higher wiring density on the circuit board. Also, as the number of layers increase to accommodate the increased number of signal lines, the number of vias in any given path also increases. A via is an electrical connection that is run through multiple layers of the circuit board to complete a signal path using two or more routing layers. Typically, the via is run generally perpendicularly to the main surface of the circuit board. In forming a via, some amount of dielectric material is removed by drilling, laser, or other methods. Next, an electrically conductive metal, usually copper, is flowed or plated into the void to provide the electrical connection between signal lines at different layers.

To avoid shorting problems, minimum clearances are defined between each via and the surrounding signal wires or reference planes. To maximize the density of wires that can be run through each layer of the circuit board, it is desirable for the spacing between the signal lines and a via to be the minimum possible while still avoiding short-circuit problems. Conventional circuit board design and manufacturing methods require minimum clearance dimensions to be maintained equally on all board layers, regardless of whether the layer is a signal layer or a power reference layer.

Typically, a transmission line on a circuit board is formed by a signal trace (routed on a signal layer of the circuit board) and a reference plane (that is provided in a power reference plane layer of the circuit board). A circuit board is designed to achieve transmission lines with a target characteristic impedance, which is usually 50 Ohms or 75 Ohms. The characteristic impedance of a transmission line is dependent on several factors: the inductance of the conductors that make up the transmission line, the dielectric medium, the distance to a reference plane, and the capacitance between the conductors.

Because vias are configured differently than signal traces, the characteristic impedance of each via is often different than that of each transmission line. Usually, the impedance of a via is less than the characteristic impedance of signal transmission lines on the circuit board. As a result, if a signal path is routed through one or more vias between different layers of the circuit board, impedance discontinuities are introduced by the presence of the vias. For signals having low frequencies, the feature dimension of a via is usually much less than a wavelength of each signal. Therefore, such a low-frequency signal usually does not experience effects of impedance discontinuity introduced by the vias. However, as the frequency of the signal increases, the feature dimension of the via becomes a significant portion of, or is even larger than, a wavelength of the signal. The transmission line impedance discontinuity introduced by vias along a signal path can cause reflections, which degrades the signal and performance of a system.

Increasing the impedance of the via usually requires increasing the minimum clearance dimension (even on the signal layers carrying signal lines), which has an undesirable result of decreasing the area available for routing of transmission lines on signal layers. Decreased routing area is usually undesirable since the alternatives to combat this are to either increase the dimensions of the board, or to add signal layers to the board.

Furthermore, an issue associated with the increase of the minimum clearance dimension at power reference plane layers is that the available area of electrically conductive material (at the power reference plane) available for carrying current can be significantly reduced.

SUMMARY

In general, a circuit board is provided that has improved signal path characteristics. For example, a circuit board includes a plurality of layers, a via extending through the plurality of layers, and clearances defined around the via at the respective layers. At least one of the clearances has a size that is different from a size of at least another one of the clearances.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
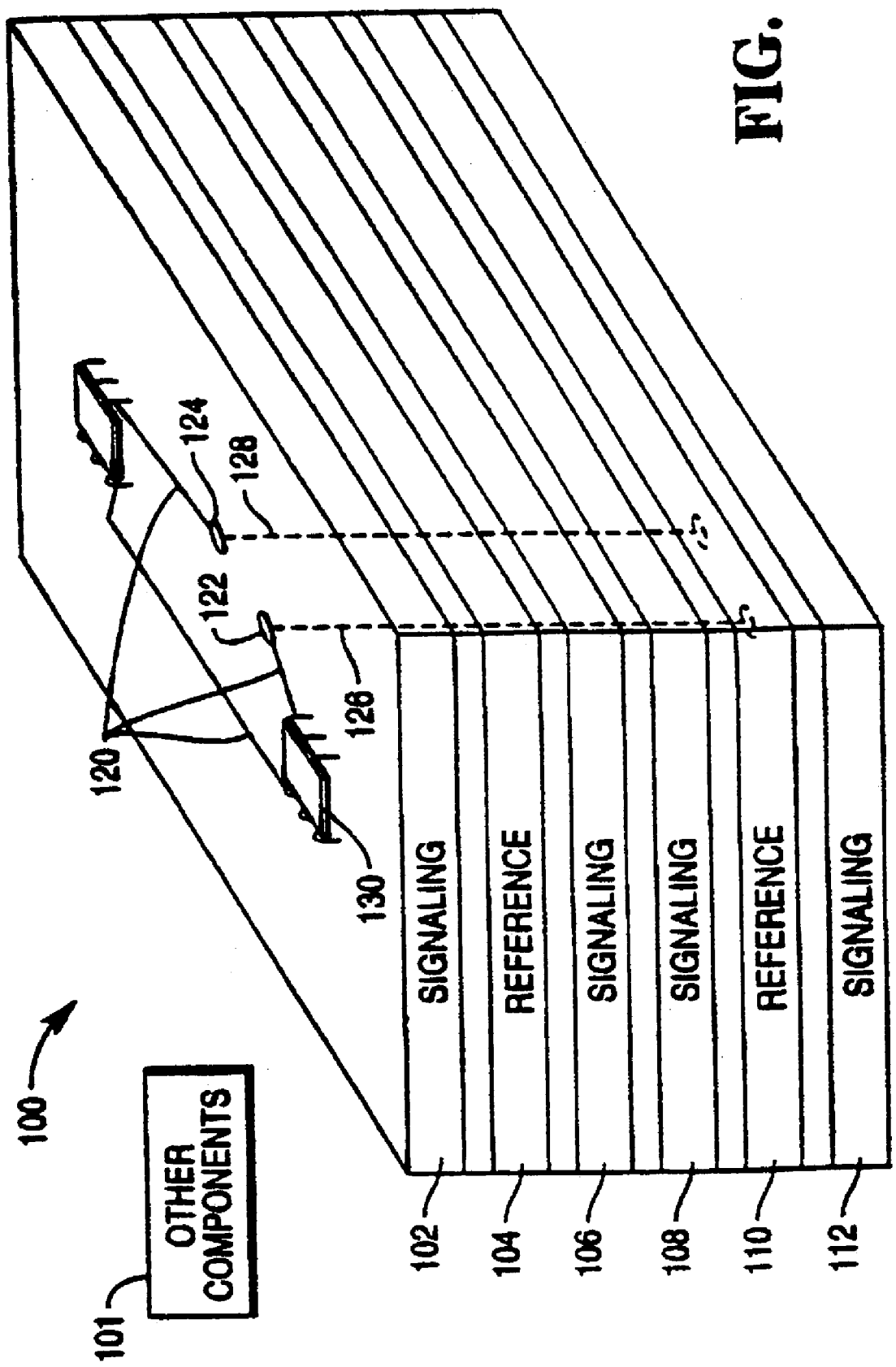
FIG. 1 illustrates an example arrangement of a circuit board.

As shown in FIG. 1, an example circuit board 100 includes multiple layers 102, 104, 106, 108, 110 and 112. As used here, a "circuit board" refers to any structure on or in which signal wires or conductors are routed and in which power reference planes are provided. Examples of a "circuit board" include printed wiring boards (PWBs) and printed circuit boards (PCBs). A "circuit board" also covers any package, such as an integrated circuit (IC) package, that has multiple layers of signal wires or conductors and power reference planes. The circuit board 100 is part of a system that includes various components, such as a hard disk drive, display, central processing unit, power supply, and so forth. The central processing unit and various controllers can be mounted on the circuit board 100 (e.g., devices 130). The power supply and hard disk drive are included as "other components" 101 in FIG. 1.

The layers 102, 106, 108, and 112, in the illustrated example, are signal layers for carrying signal wires, while the layers 104 and 110 are power reference plane layers. In each signal layer of the circuit board 100, signal traces are routed through the layer. All power reference planes are attached to either a power supply voltage (such as a 3-volt, 5-volt, or other voltage) or ground. Thus, for example, the power reference plane layer 104 is connected to a power supply voltage, while the power reference plane layer 110 is connected to a ground potential. In some implementations, a power reference plane layer is formed of a solid sheet of electrically conductive metal (or other electrically conductive material), with openings formed in the solid sheet for vias or other through-hole structures.

In the example shown in FIG. 1, devices 130 are mounted on a planar surface of the circuit board 100. Signal traces 120 in the layer 102 route signals from the devices 130 to other points on the circuit board 100. In the example shown in FIG. 1, some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100. In the example shown in FIG. 1, the vias 126 and 128 are passed from the top signal layer 102 to the bottom signal layer 112 of the circuit board. Other vias can be connected between any pair of signal layers.

A "via" refers generally to any electrically conductive structure that electrically connects lines or components at different layers of a circuit board. The circuit board 100 has a main surface that is generally parallel to the signal traces and power reference planes. Vias are routed in a direction that is generally perpendicular to the main surface of the circuit board 100. However, other embodiments of the invention also cover cases where vias are routed at other angles with respect to the main surface through multiple layers of the circuit board.

Typically, a through-hole is formed through the layers through which a via is to pass, with an electrically conductive material (such as a metal) deposited or otherwise formed in the through-hole to make an electrical connection.

When a via is passed through one or more layers, minimum clearances are defined around the via at each of these layers to avoid short-circuiting the via to either a power or ground plane or to another signal. Thus, for example, for each of the vias 126 and 128, clearances are defined around the via 126 or 128 at each of layers 104, 106, 108, and 110. The clearances are also referred to as "anti-pads." Basically, a "clearance" is a defined region around a via in each layer of the circuit board through which an electrically conductive structure other than the via or a signal trace intended to connect to the via is not allowed to pass. The clearance can be circular, rectangular, or any other shape.

To enhance wire density at each signal layer, the clearance defined around a via at the signal layer is desired to have as small a feature as possible while still being effective in isolating the via and other electrically conductive structures at the signal layer.

While a high density of signal traces at a signal layer is desired to enable more signal wires to be run through each signal layer of the circuit board 100, the same goal usually does not extend to certain power reference plane layers of the circuit board. That is because a power reference plane is typically made up of a solid layer or sheet of an electrically conductive metal such as copper. Defining a larger clearance around a via at certain of the reference plane layers does not affect the performance of these power reference plane layers. However, for other power reference layers, it is not desirable to increase the clearance size around the via, since increasing clearance size results in a reduction of electrically conductive material in the power reference plane.

For example, in a region that has a high via density, larger clearances around the vias will result in a substantially reduced area of the power reference plane in the region. The reduced area of the power reference plane may lead to a reduced ability to carry or supply electrical charge and an increase in resistance (which leads to increased voltage drop). Usually, in areas of dense vias, a relatively large amount of current may have to be carried or supplied by a power reference plane that is proximate a signal layer. Depending on circuit operation, one power reference plane has to supply current to signal lines, while another power reference plane has to receive return current. In accordance with some embodiments, in a region of a power reference plane that has to carry or supply a substantial amount of electrical charge for signal lines in signal layers that are proximate the power reference plane, smaller clearances (smaller than those used at some other power reference plane layers) are provided around vias so that a larger area of electrically conductive material is available to carry the electrical charge.

In effect, the clearance around a via at a first group of power reference plane layers is defined to be larger than the clearance around the via at a signal layer. The increased clearance around the via at such power reference plane layers allows the impedance of the via to be increased (due to the increased distance between the via and the power reference plane conductor) so that the impedance of the via can be matched as closely as possible to the impedance of a signal transmission line in the circuit board. However, at other power reference plane layers (referred to as a second group of power reference plane layers), the clearance around the via is kept at a size that is smaller than the clearance at the first group of power reference layers. The clearance around the via at the second group of power reference plane layers can be the minimum clearance used at signal layers, or it can have a size between the minimum clearance and the clearance of the first group at power reference planes.

In another embodiment, in area of dense vias, a large combined clearance or antipad is provided around each of selected groups of vias to provide the tailoring of via impedance. Such a technique is desirable in regions where there is not sufficient room to freely adjust the clearance or antipad size, and also in regions where individual enlarged clearances will cause too much electrically conductive material to be removed from a power reference plane layer.

In some of the arrangements discussed above, tailoring of via impedance by varying clearance size can be accomplished while ensuring that the ability of certain power reference plane layers to carry or supply electrical charge is not adversely affected. This is achieved by using different clearance sizes around a via, or group of vias, at different power reference plane layers.

Although reference is made to increasing the impedance of a via in some embodiments, it is contemplated that the impedance of a via can also be decreased to reduce impedance discontinuity between a signal transmission line and the via. Thus, more generally, the impedance of the via is said to be adjusted or tailored to reduce impedance discontinuity between a signal transmission line and a via. Reducing impedance discontinuity refers to reducing the difference in impedances of the signal transmission line and the via.

Figure 2:
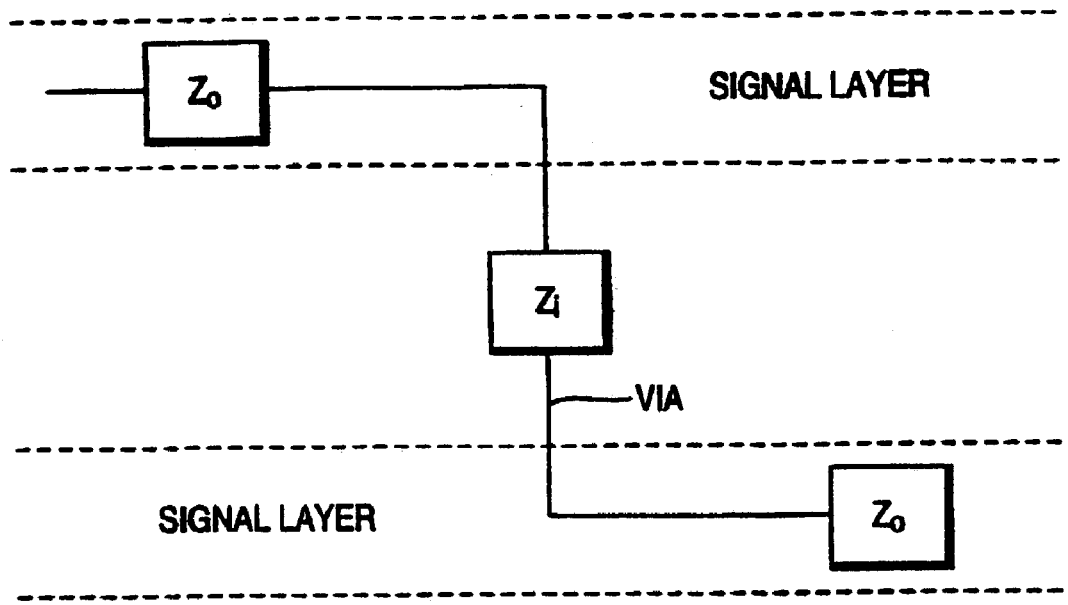
FIG. 2 is a schematic diagram of a signal path in the circuit board.

Schematically, the impedance of a signal transmission line in each signal layer is represented as $Z_o$, as shown in FIG. 2. FIG. 2 shows two signal transmission lines at two signal layers of the circuit board 100. FIG. 2 also shows the via as having a characteristic impedance $Z_i$. The via can be thought of as being a separate transmission line (with characteristic impedance $Z_i$) that is cascaded with signal transmission lines each with characteristic impedance $Z_o$.

Figure 3:
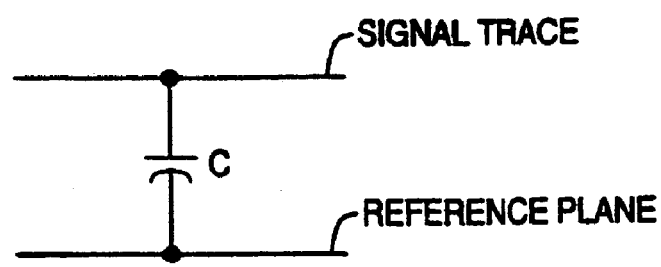
FIG. 3 is a schematic diagram of a transmission line.

As used here, a "signal transmission line" refers to a transmission line formed by the combination of a signal trace in a signal layer, a reference plane, and a dielectric layer between the signal trace and reference plane with a capacitance C. This is shown in FIG. 3. Similarly, a "via transmission line" refers to a transmission line formed by the combination of a via, one or more reference planes, and the dielectric between the via and the one or more reference planes.

A transmission line can be a parallel-plate transmission line or a two-wire transmission line. In either case, the characteristic impedance of a transmission line is derived from the inductance (L) and capacitance (C) of the transmission line:

$$Z_o \cong \sqrt{\frac{L}{C}}.$$

The inductance of a signal transmission line is dependent upon the width and thickness of the signal trace. The capacitance of the signal transmission line is dependent upon the spacing between the plates (the spacing between the signal trace and the reference plane), the type of dielectric between the signal trace and the reference plane, and the width of the signal trace. A circuit board is designed so that each signal transmission line has a characteristic impedance of 50 ohms, 75 ohms, or another target characteristic impedance.

However, due to its different arrangement, a via usually has a different impedance, which results in impedance discontinuity between the via transmission line and the signal transmission line. To avoid as much as possible the problem of reflections of signals transmitted over a signal path that includes one or more signal transmission lines and one or more via transmission lines, it is desired to match as closely as possible the impedance of the via transmission line to the impedance of the signal transmission line.

As noted above, this is accomplished by increasing the clearance between the via and certain power reference planes through which the via passes. Increasing the clearance between a via and a reference plane causes the effective capacitance of the via transmission line to be decreased so that the via characteristic impedance is increased. The increase in clearance is not provided at any signal layer so that routing space in the signal layer is not reduced. Thus, in accordance with some embodiments of the present invention, the impedance of a via can be tailored without sacrificing routing space at a signal layer of the circuit board. Also, as noted above, the via impedance is tailored without sacrificing electrical charge or current carrying capacity at selected power reference planes.

The tailored via clearances around a via at a reference plane layer can be implemented just for signal paths over which high-frequency signals are expected. Thus, for low-frequency signal paths, the clearances around a via can be the same at signal layers and reference plane layers.

Figure 4:
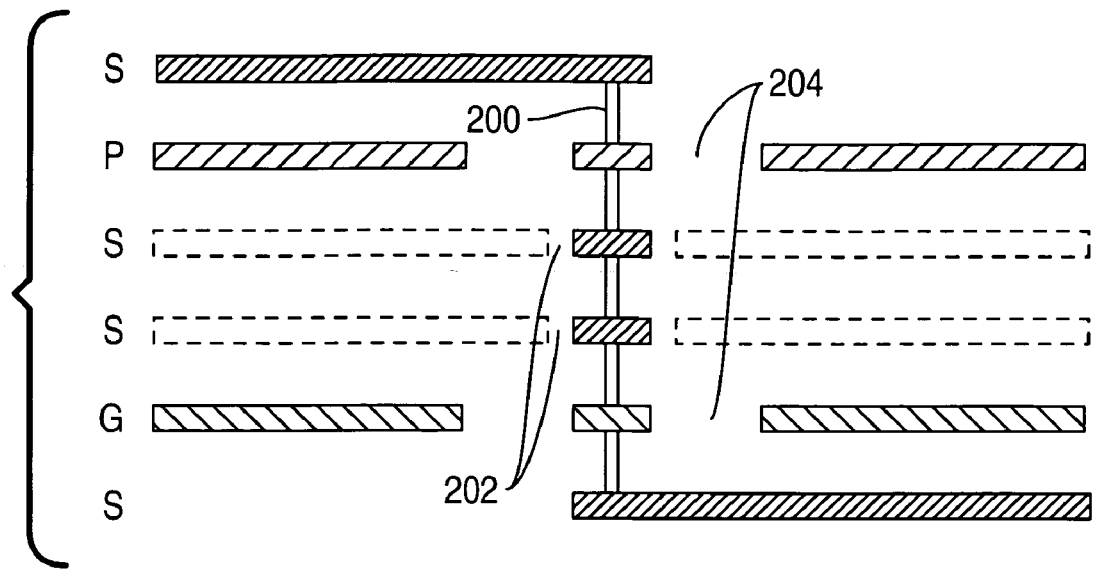
FIG. 4 is a cross-sectional view of the circuit board of FIG. 1.
Figure 5:
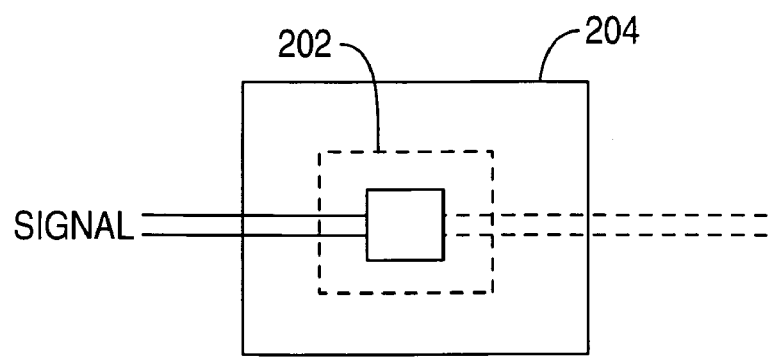
FIG. 5 is a top view to show the different dimensions of clearances at a signal layer and at a reference plane layer of the circuit board.

According to one embodiment, the different clearances around the via at different layers is illustrated in FIG. 4. As shown, a first clearance 202 having a first size is provided around a via at each of the signal layers 106 and 108. A second clearance 204 having a second, larger size is provided around the via at the power reference plane layers 104 and 110. A top view of the difference sizes of the clearances 202 and 204 at the reference plane layers and at the signal layers is shown in FIG. 5. In this embodiment, it is assumed that an enlarged clearance can be used at each power reference layer (i.e., reduced area of electrically conductive material is not a concern). Other embodiments in which different power reference plane layers have different sizes of clearances around vias are described further below.

Figure 6:
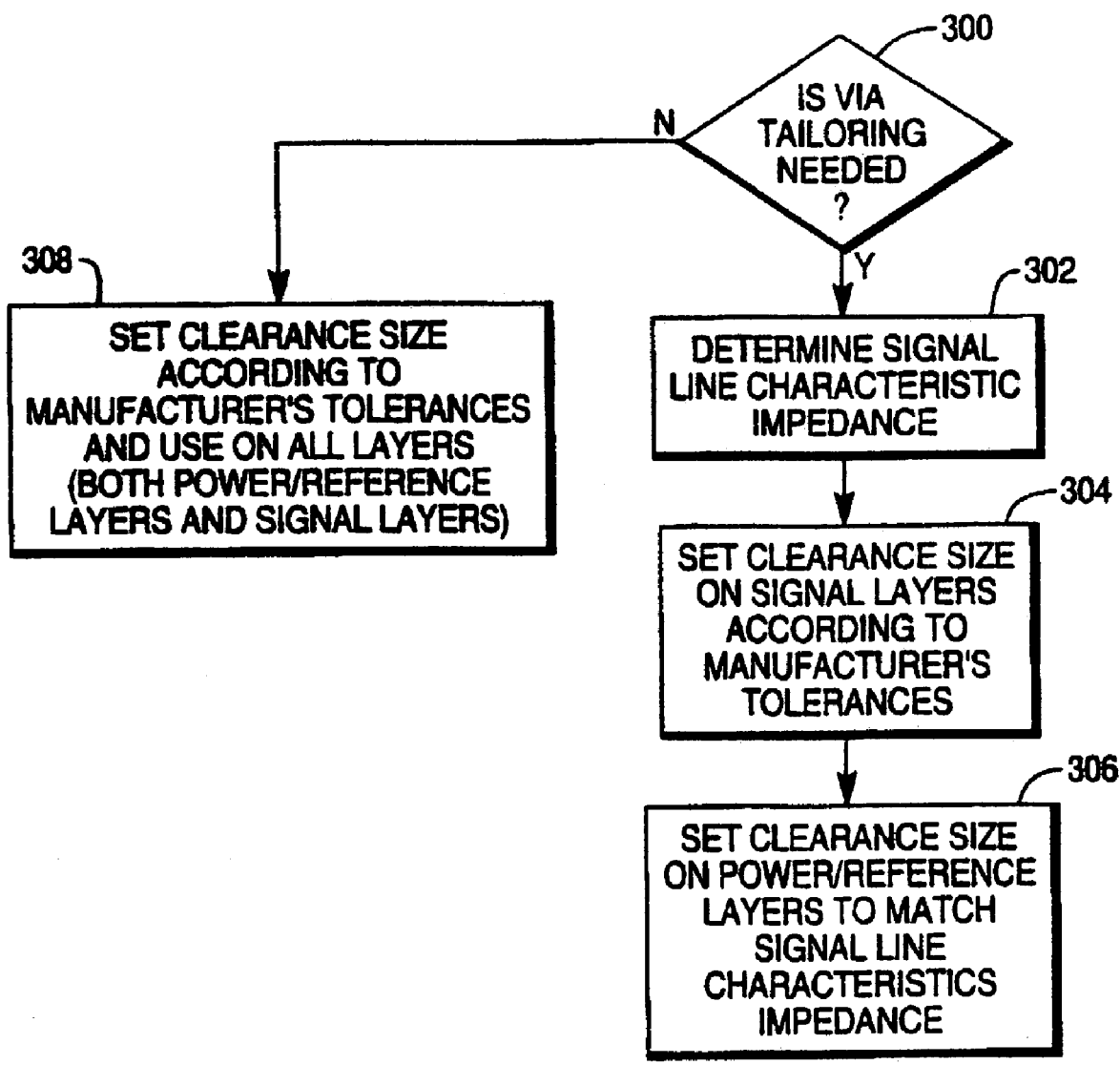
FIG. 6 is a flow diagram of a process of setting via clearance sizes.

Selection of the size of a tailored clearance around a via at a reference plane layer is based on the signal transmission line impedance. Thus, as shown in FIG. 6, it is first determined (at 300) if via clearance tailoring is needed for a given signal path. In most cases, tailoring is not needed for relatively low-frequency signal paths. For such vias, the clearance size at each circuit board layer, whether signal layer or reference layer, is set to the same size according to manufacturer's tolerances. If tailoring is needed, the signal transmission line characteristic impedance is determined (at 302). Next, the clearance size at each signal layer is set (at 304) according to manufacturer's tolerances. The size of the via clearance at each reference plane layer is then set (at 306) to tailor the impedance of the via to match as closely as possible the signal transmission line impedance. The procedure is repeated for each of the other signal paths on the circuit board.

The above procedure, in some embodiments, is performed by software in a computer system. The software is stored as instructions on a storage medium. The instructions are loaded for execution by a processor in the computer system to perform predefined tasks.

Figure 7:
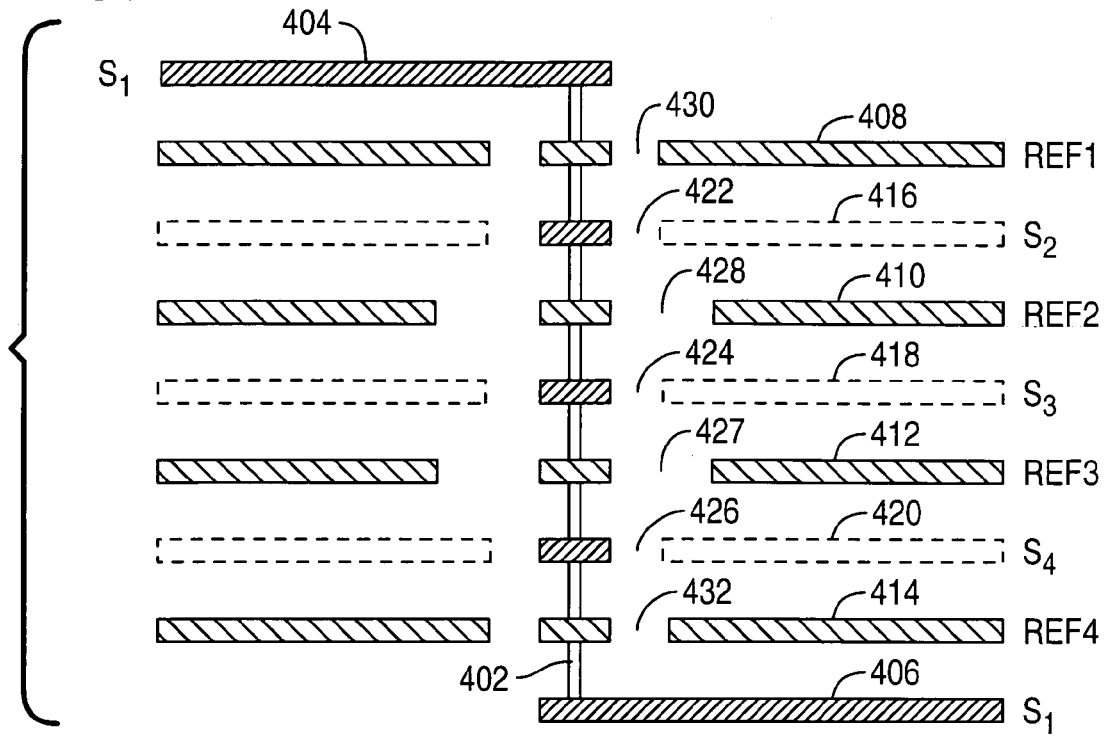
FIGS. 7–9 are cross-sectional views of further embodiments of a circuit board.

FIG. 7 shows an alternative embodiment of a circuit board in which certain power reference plane layers use different clearance sizes around a via 402. In the embodiment shown in FIG. 7, the via 402 carries current from a signal line 404 in one signal layer to another signal line 406 in another signal layer. The signal lines 404 and 406 are in signal layers that are separated by intermediate layers, including power reference plane layers 408, 410, 412, and 414. The intermediate layers also include other signal layers 416, 418, and 420.

As shown in the example of FIG. 7, clearances 422, 424, and 426 at signal layers 416, 418, and 420, respectively, defined around the via 402 are minimum clearances (that are associated with a minimum size according to constraints of the manufacturing process and materials and arrangement of the circuit board). To tailor the impedance of the via 402, clearances 428 and 427 at power reference plane layers 410 and 412, respectively, each has a larger size than the size of the clearances 422, 424, and 426. However, the clearances 430 and 432 of the power reference plane layers 408 and 414, respectively, are smaller than the clearances 428 and 427 at the power reference plane layers 410 and 412. This enhances the ability of each of the power reference plane layers 408 and 414 to carry electrical charge or current associated with respective signal lines 404 and 406 in respective regions around the via 402 at the power reference plane layers 408 and 414.

Figure 8:
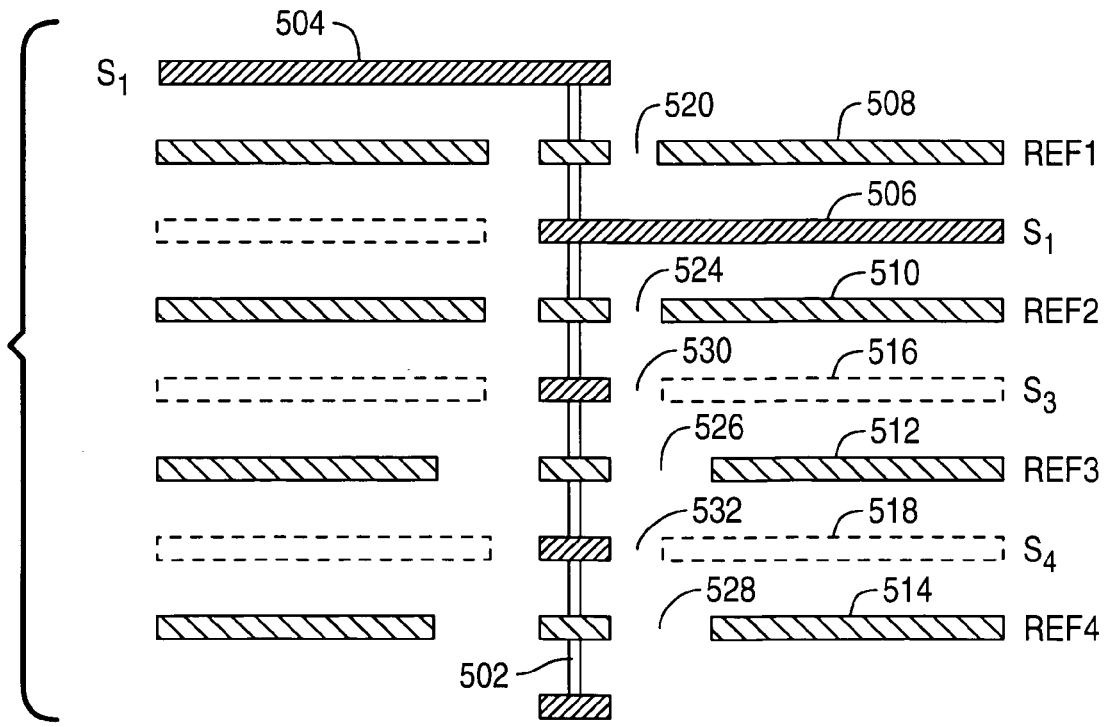

FIG. 8 shows another via 502 that connects a signal line 504 at a first signal layer and a signal line 506 at a second signal layer. A power reference plane layer 508 is provided between the signal layers containing signal lines 504 and 506. Additional layers are provided below the signal layer containing signal line 506, including power reference plane layers 510, 512, and 514, as well as signal layers 516 and 518. In this alternative arrangement, clearances 520 and 524 at power reference plane layers 508 and 510, respectively, have a size that is smaller than a clearance 526 at the power reference plane layer 512. The power reference plane layers 508 and 510 are selected to have a smaller clearance size due to the fact that they are proximate the signal lines 504 and 506 and have to carry electrical charge associated with the signal lines 504 and 506 in regions around the via 502. The lowermost power reference plane layer 514 shown in FIG. 8 also has a clearance 528 that is larger than the clearances 520 and 524 around the via 502 at power reference plane layers 508 and 510. Clearances 530 and 532 at signal layers 516 and 518, respectively, have a small clearance size.

Even though power reference plane layers 512 and 514 are not in the signal path (made up of signal line 504, the upper portion of via 502, and signal line 506), the power reference plane layers 512 and 514 still influence the overall characteristic impedance of the via 502. The portion of the via 502 below the signal layer containing signal line 506 is effectively a stub that is associated with the capacitance that is seen by the signal path made up of signal lines 504, 506 and the upper portion of the via 502.

Figure 9:
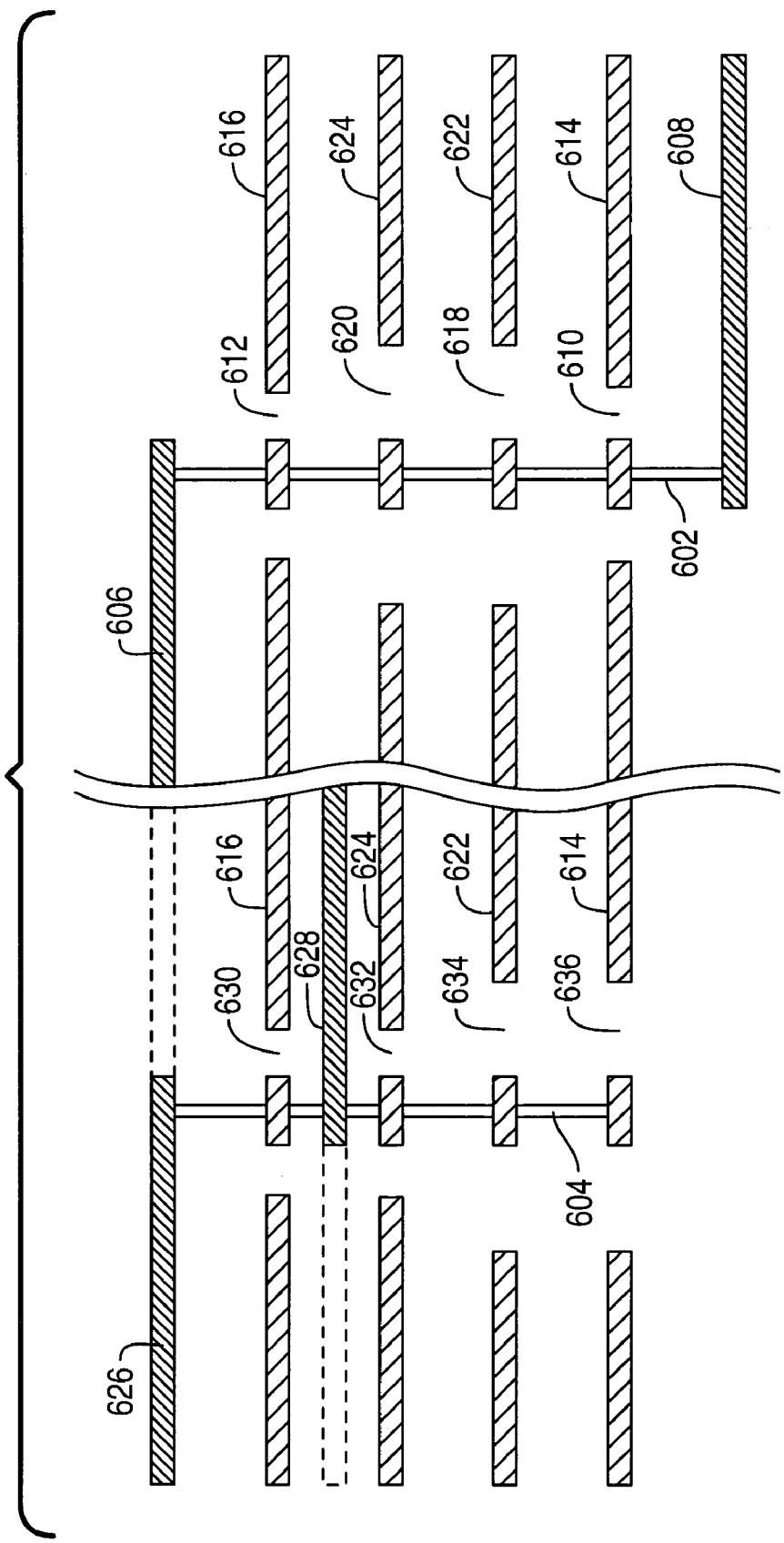

FIG. 9 shows an arrangement in which each given power reference plane is capable of having two different clearance sizes. FIG. 9 shows a circuit board arrangement that is effectively a combination of the arrangements of FIGS. 7 and 8 (certain signal layers have been omitted). In the arrangement of FIG. 9, on the right hand side, a signal line 606 at an upper signal layer is connected by a via 602 to a signal line 608 at a lower signal layer. The size of clearances 610 and 612 at power reference plane layers 614 and 616, respectively, is smaller than the size of clearances 618 and 620 at intermediate power reference plane layers 622 and 624, respectively. On the left hand side of the circuit board, an upper portion of a via 604 connects a signal line 626 at a first signal layer and a signal line 628 at another signal layer. Clearances 630 and 632 at the power reference plane layers 616 and 624, respectively, proximate the signal layers containing signal lines 626 and 628 have a smaller size than clearances 634 and 636 at power reference plane layers, 622 and 614, respectively.

Therefore, as shown in FIG. 9, clearances sizes may vary on one power reference plane layer. The size of a given clearance around a via depends on whether a relatively large charge or current carrying capacity is expected at the power reference plane layer in the vicinity of the given via.

Figure 10:
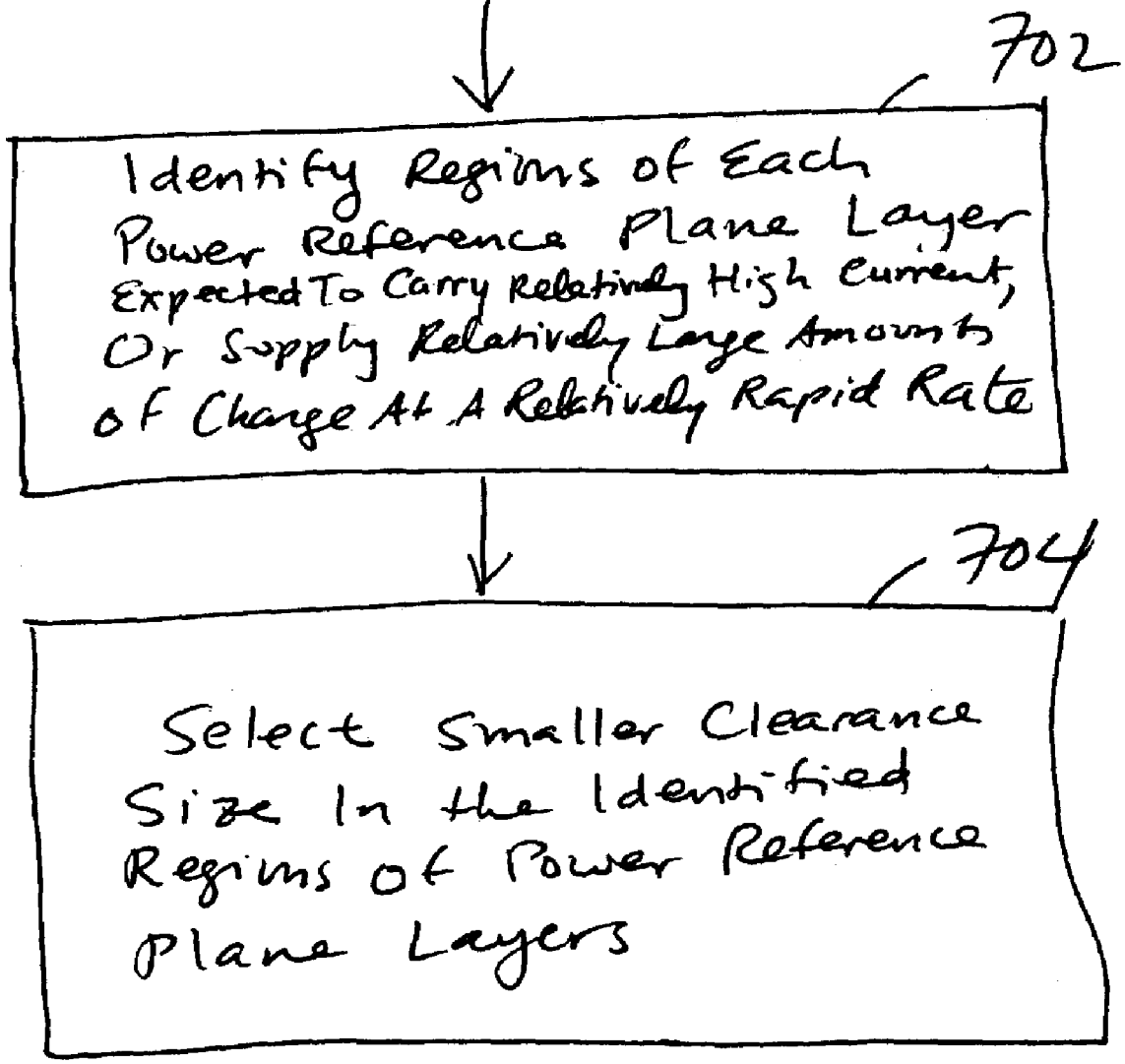
FIG. 10 is a flow diagram of a process according to a further embodiment.

FIG. 10 shows a process (performed by software in a computer system) that is an extension of the process of FIG. 6. According to some embodiments, tailoring of the impedance of a via is subject to the requirement that the effectiveness of a power reference plane to carry charge or current is not adversely compromised by increasing a clearance size. Therefore, in performing tailoring of via impedance, regions of each power reference plane layer that are expected to carry relatively high currents or that are expected to supply relatively large amounts of charge at a rapid rate are identified (at 702). The size of clearances in those regions of each power reference plane layer is selected (at 704) to have a smaller size than at other power reference plane layers. For example, the smaller size is the minimum clearance size used at signal layers.

Figure 11:
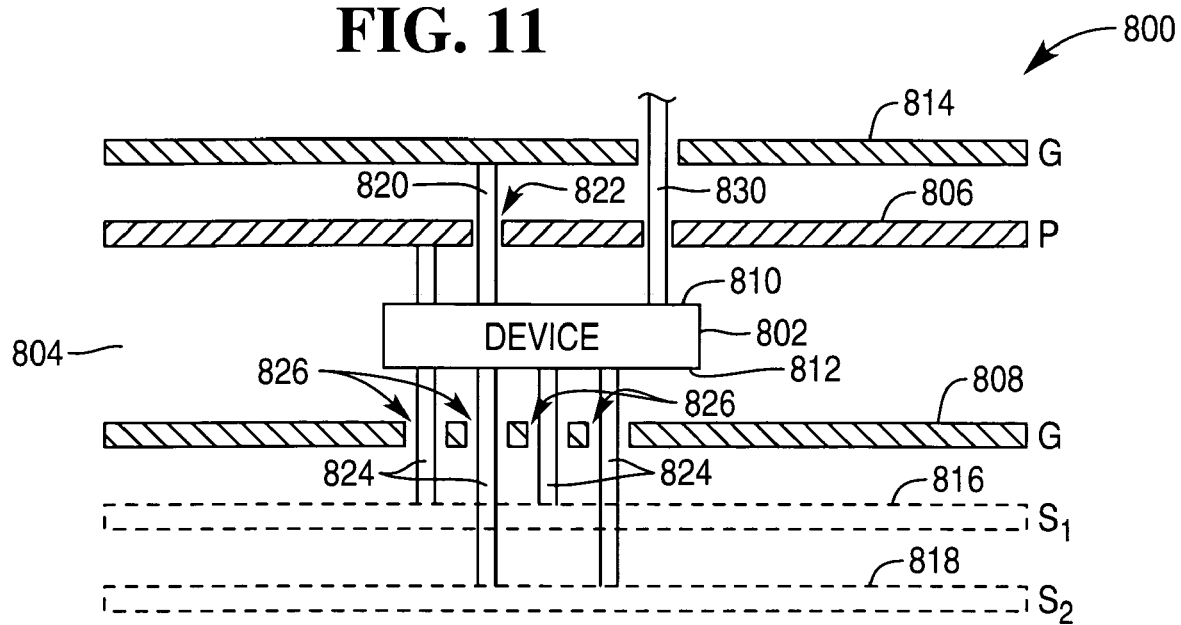
FIGS. 11 and 12 are cross-sectional views of other embodiments of a circuit board.

FIG. 11 shows yet another embodiment of a circuit board 800 in which different sizes of clearances at different power reference plane layers is used. In the arrangement of FIG. 11, the circuit board 800 includes an embedded device, such as an IC device. An embedded device refers to a device that is provided between layers of a circuit board, instead of being mounted on a top or bottom surface of the circuit board. In FIG. 11, an embedded device 802 is provided in an insulator layer 804 between power reference plane layers 806 and 808. The embedded device 802 has an upper surface 810 and a lower surface 812. The type of device 802 used in FIG. 11 is one in which bond pads are provided on both the upper and lower surfaces 810 and 812. The upper bond pads on the upper surface 810 of the embedded device 802 are electrically connected to a power supply voltage plane (in reference plane layer 806) and a ground potential (in reference plane layer 814). On the other hand, bond pads formed on the lower surface 812 of the device 802 are connected to signal lines in signal layers 816 and 818.

Effectively, the circuit board 800 has an arrangement in which power reference plane connections are provided in one direction (the upper direction in FIG. 11), while signal connections are in the opposite direction (in the lower direction in FIG. 11). Note that the orientation of the power reference planes 814 and 806 and signal layers 816 and 818 can be flipped, with associated power bond pads and signal bond pads on the device 802 flipped accordingly. In other words, in a different arrangement, the power bond pads of the device 802 are provided on the lower surface 812 of the device, while the signal bond pads are provided on the upper surface 810.

In the arrangement of FIG. 11, the power supply voltage plane in reference layer 806 and ground plane in reference layer 814 are the ones that carry the electrical charge or current of the device 802. The power supply voltage reference plane layer 806 supplies current to the device 802, while the ground reference plane layer 814 receives returned current from the device 802. To enhance the effectiveness of the power reference plane layers 806 and 814 in carrying electrical current, the clearances around vias at the power reference plane layers 806 and 814 are of a reduced size. For example, a via 820 extends from the device 802 to connect to the ground plane. A clearance 822 is provided around the via 820 at the power reference plane layer 806. This clearance 822 has a reduced clearance size. Similarly, for a via 830 from the device 802 (or from any other device) that extends through the power reference plane layers 806 and 814, the clearances around the via 830 are also of a reduced size.

On the other hand, larger clearance sizes can be defined for power reference plane layers below the device 802 (that is, power reference plane layers that are located on the opposite side of the device 802 from the power reference plane layers 806 and 814). An example of such a power reference plane layer is ground reference plane layer 808 in FIG. 11. Multiple vias 824 connect the device 802 to signal layers 816 and 818. The vias 824 pass through the ground reference plane layer 808. The size of the clearances 826 defined around the vias 824 at the power reference plane layer 808 is an enlarged size.

Figure 12:
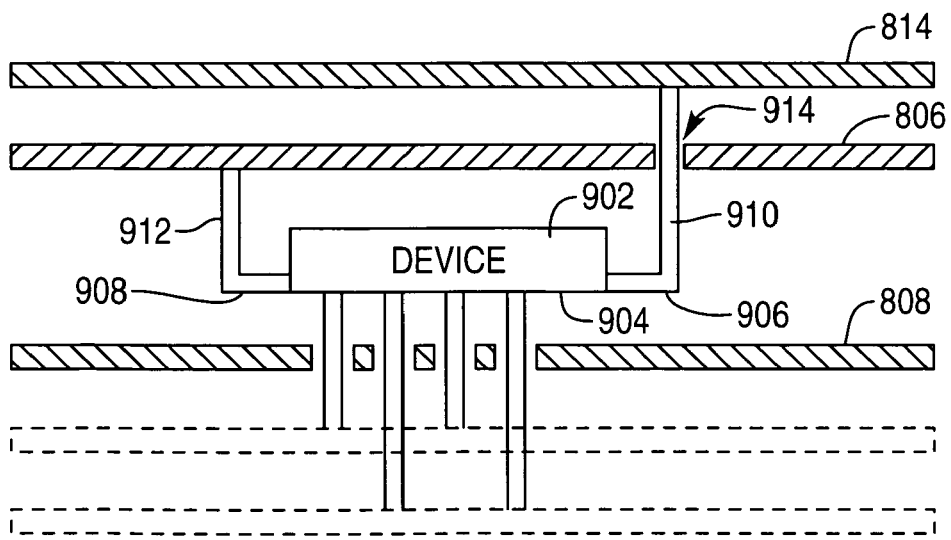

The IC device 802 in FIG. 11 has bond pads provided on both the upper and lower surfaces 810 and 812 of the device 802. In a different embodiment, another device 902 (FIG. 12) provides bond pads only on one surface 904 of the device 902. In such a case, a different mechanism is provided to connect the bond pads of the device 902 to the power reference plane layers 814 and 806. In the arrangement, traces 906 and 908 extend laterally from power bond pads on the lower surface 904 of the device 902. The traces 906 and 908 are electrically connected to respective vias 910 and 912. The via 912 is electrically connected to the power reference plane layer 806, while the via 910 is electrically connected to the power reference plane layer 814. The via 910 passes through the power reference plane layer 806, with a clearance 914 (of a smaller size) defined at the power reference plane layer 806 around the via 910. The signal bond pads of the IC device are similarly connected to signal layers 816 and 818 by vias 824, with vias passing through clearances 826 at the power reference plane layer 808.

Figure 13A:
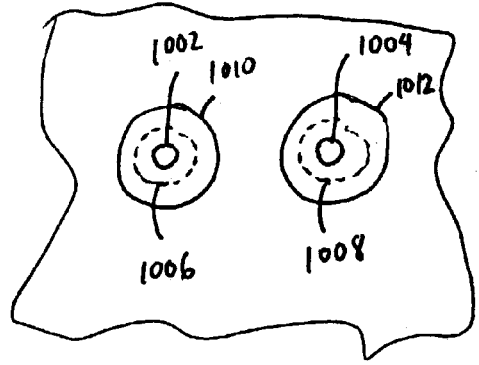
FIGS. 13A–13D are cross-sectional views of a portion of a circuit board containing a dense arrangement of vias.

FIGS. 13A–13D show yet another embodiment of implementing enlarged clearances around vias to tailor the impedance of such vias. FIG. 13A shows two vias 1002 and 1004 in close proximity to each other. The dashed circles 1006 and 1008 around the vias 1002 and 1004, respectively, indicate the clearances around the vias at signal layers. On the other hand, the solid circles 1010 and 1012 around the vias 1002 and 1004, respectively, indicate enlarged clearances around the vias at a power reference plane layer.

Note, however, that due to the proximity of the vias 1002 and 1004, the clearances 1010 and 1012 are very close to each other, which means that the available electrically conductive area at the power reference plane layer in the proximity of the vias 1002 and 1004 is substantially reduced. If the cross-sectional area of each of the clearances 1010 and 1012 is indicated as A, then the total area occupied by the clearances 1010 and 1012 is 2A.

Figure 13B:
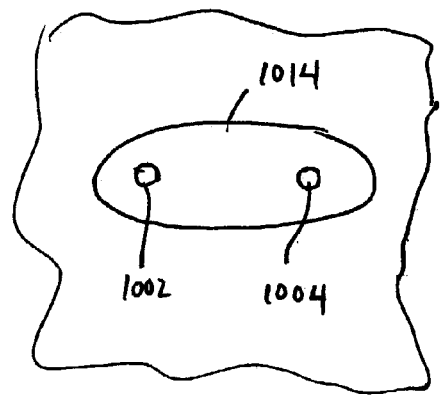

To reduce the amount of electrically conductive material removed from the power reference plane layer, a "combined" clearance 1014 is used, as shown in FIG. 13B. The combined clearance 1014 encloses both vias 1002 and 1004. Therefore, instead of using two separate clearances 1010 and 1012, as shown in FIG. 13A, one combined clearance 1014 is used. The combined clearance 1014 is selected to have a cross-sectional area that is less than 2A, while still being able to provide tailoring of impedances of the vias 1002 and 1004. As a result, less electrically conductive material is removed from the power reference plane layer.

The same concept can be extended to groups of more than two vias. More generally, given a group of N closely arranged vias, a combined clearance can be defined around the group of N vias, with the combined clearance having less than an N*A cross-sectional area.

Figure 13C:
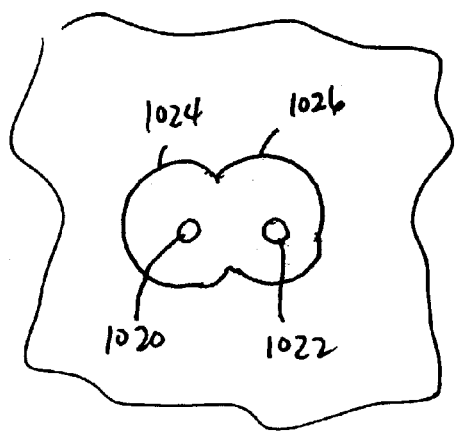
Figure 13D:
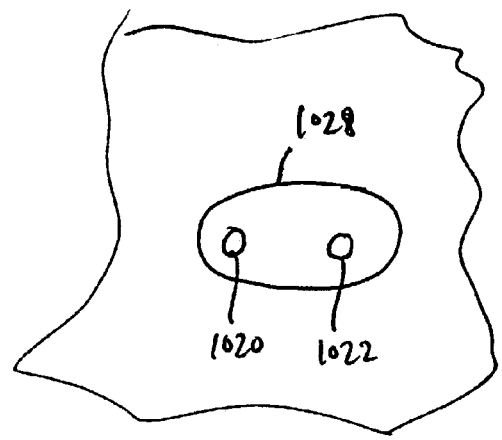

FIG. 13C shows two vias 1020 and 1022 that are even more closely arranged together than the vias 1002 and 1004 shown in FIG. 13A. In this case, the enlarged clearances 1024 and 1026 around the vias 1020 and 1022, respectively, overlap each other. To reduce the amount of electrically conductive material removed from the power reference plane layer, a combined clearance 1028 (FIG. 13D) is defined around the vias 1020 and 1022, with combined clearance 1028 having a cross-sectional area that is much smaller than 2A.

While the invention has been disclosed with respect to a limited number of embodiments, those skilled in the art will appreciate numerous modifications and variations there from. It is intended that the appended claims cover such modifications and variations as fall within the true spirit and scope of the invention.

What is claimed is:

1. A circuit board comprising:
   a plurality of layers;
   a device between two of the plurality of layers,
   wherein a first one of the layers containing a power reference plane is provided on a first side of the device, and wherein a second one of the layers containing a power reference plane is provided on a second, opposite side of the device;
   a first via passing through the first one the layers;
   a second via passing through the second one of the layers;
   a first clearance defined around the first via at the first one of the layers; and
   a second clearance defined around the second via at the second one of the layers,
   wherein the first clearance is larger than the second clearance.

2. The circuit board of claim 1, wherein the plurality of layers further comprise signal layers provided on the first side of the device.

3. The circuit board of claim 2, wherein the first via further passes through the signal layers, the circuit board further comprising a third clearance defined around the first via at the signal layer, the first clearance being larger than the third clearance.

4. The circuit board of claim 3, wherein a third one of the layers containing a power reference plane is also provided on the second side of the device.

5. A circuit board comprising:
   plural layers containing power reference planes;
   vias passing through the plural layers;
   a first clearance defined around a first via at a first one of the plural power reference plane layers, the first clearance having a first size;
   a second clearance defined around a second via at a second one of the plural power reference plane layers, the second clearance having a second size different from the first size; and
   a device provided between two of the plural power reference plane layers,
   wherein at least one power reference plane layer is provided on one side of the device, and at least another power reference plane is provided on another side of the device.

6. The circuit board of claim 5, wherein the first one of the plural power reference plane layers is provided on a first side of the device, and the second one of the plural power reference plane layers is provided on a second, opposite side of the device.

7. The circuit board of claim 6, wherein at least a third one of the power reference plane layers is provided on the second side of the device, a third via passing through the power reference plane third one of the layers,
- the circuit board further comprising a third clearance defined around the third via at the third one of the power reference plane layers, the third clearance having generally the second size.

8. A circuit board comprising:
a plurality of layers;
a first via extending through the plurality of layers;
clearances defined around the first via at two or more of the respective layers,
wherein at least one of the clearances has a size that is different from at least another one of the clearances, wherein the different size is selected to set a desired impedance of the first via, and
wherein one of the plurality of layers comprises a signal layer and another one of the plurality of layers comprises a power reference plane layer, wherein the clearance at the signal layer is smaller than the clearance at the power reference plane layer,
a second via extending at least through the signal layer and the power reference plane layer; and
another clearance defined around the second via at the signal layer,
wherein the clearance at the power reference plane layer is defined around both the first and second vias.

9. A circuit board comprising:
a plurality of layers;
a first via extending through the plurality of layers;
clearances defined around the first via at two or more of the respective layers,
wherein at least one of the clearances has a size that is different from at least another one of the clearances, wherein the different size is selected to set a desired impedance of the first via, and
wherein one of the plurality of layers comprises a signal layer and another one of the plurality of layers comprises a power reference plane layer, wherein the clearance at the signal layer is smaller than the clearance at the power reference plane layer; and
a second via extending at least through the power reference plane layer,
wherein the clearance at the power reference plane layer is defined around both the first and second vias.

10. The circuit board of claim 9, further comprising at least another via extending at least through the power reference plane layer,
wherein the clearance at the power reference plane layer is defined around all of the first via, the second via, and the at least another via.

11. A method of making a circuit board comprising: providing a plurality of layers; forming a first via through the plurality of layers; and forming clearances around the via at the respective layers, wherein at least one of the clearances has a size that is different from a size of at least another one of the clearances, wherein providing the plurality of layers comprises providing layers having power reference planes, wherein providing the plurality of layers further comprises providing at least one signal layer, wherein providing a clearance at the signal layer comprises providing a clearance that is smaller than a clearance at one of the layers having a power reference plane, further comprising providing at least another via through the plurality of layers, wherein providing the clearance at one of the layers havinf a power reference plane comprises providing the clearance around all of the first via and the at least another via.

* * * * *